(12) United States Patent
Park et al.

(10) Patent No.: US 7,648,923 B2
(45) Date of Patent: Jan. 19, 2010

(54) METHOD OF FABRICATING SEMICONDUCTOR DEVICE

(75) Inventors: Eun-Shil Park, Kyeongki-do (KR); Kwon Hong, Kyeongki-do (KR); Jae Hong Kim, Kyeongki-Do (KR); Jae Hyoung Koo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 50 days.

(21) Appl. No.: 11/963,907

(22) Filed: Dec. 24, 2007

(65) Prior Publication Data

US 2009/0098738 A1 Apr. 16, 2009

(30) Foreign Application Priority Data

Oct. 10, 2007 (KR) .................. 10-2007-0102121

(51) Int. Cl.
*H01L 21/31* (2006.01)
(52) U.S. Cl. .................... 438/769; 438/770; 438/775
(58) Field of Classification Search .......... 438/769, 438/770, 775, 787, 791, 591, 263, 264, 287
See application file for complete search history.

(56) References Cited

U.S. PATENT DOCUMENTS

| | | | | |
|---|---|---|---|---|
| 6,541,395 | B1 * | 4/2003 | Trivedi et al. | 438/775 |
| 6,953,747 | B2 * | 10/2005 | Cho | 438/663 |
| 7,381,619 | B2 * | 6/2008 | Wang et al. | 438/275 |
| 2007/0167030 | A1 * | 7/2007 | Jee et al. | 438/769 |

FOREIGN PATENT DOCUMENTS

| | | |
|---|---|---|
| KR | 10-2005-0086296 | 8/2005 |
| KR | 10-2006-0058813 | 6/2006 |
| KR | 10-2007-0027274 | 3/2007 |
| KR | 10-2007-0064392 | 6/2007 |

\* cited by examiner

*Primary Examiner*—Kevin M Picardat
(74) *Attorney, Agent, or Firm*—Marshall, Gerstein & Borun LLP

(57) ABSTRACT

A method of fabricating a flash memory device is disclosed. The method comprises forming a first insulating layer on a semiconductor substrate; accumulating nitrogen at an interface between the semiconductor substrate and the first insulating layer to form a second insulating layer at the interface; and implanting oxygen into the second insulating layer to convert the second insulating layer to a third insulating layer.

15 Claims, 1 Drawing Sheet

METHOD OF FABRICATING SEMICONDUCTOR DEVICE

CROSS-REFERENCE TO RELATED APPLICATION

Priority to Korean Patent Application No. 2007-102121, filed on Oct. 10, 2007, the contents of which are incorporated herein by reference in its entirety, is claimed.

BACKGROUND OF THE INVENTION

The invention relates to a method of fabricating a semiconductor device, and more particularly relates to a method of fabricating a semiconductor device capable of improving the nitrogen (N) profile and degradation characteristics of a tunnel oxide layer.

In semiconductor devices, a flash memory device is a nonvolatile memory device capable of storing information in a memory cell and performing an electrical erasing operation at a high rate when the memory device is mounted to a circuit board and the power is shutoff. Studies have focused on developing structures having an increased level of integration of the memory device. A unit cell of the above flash memory device is formed by laminating sequentially a tunnel oxide layer, a floating gate, a dielectric layer and a control gate on an active area of a semiconductor substrate. Unlike a gate insulating layer in a conventional transistor, the tunnel oxide layer in the above unit cell structure acts as a data conduit, and so an excellent layer characteristic of the tunnel oxide layer is required.

In a NAND flash memory device, the program and erase operations are performed using Fowler-Nordheim (F-N) tunneling. Accordingly, after numerous program and erase cycles, the tunnel oxide layer degrades and the memory device no longer functions properly. Therefore, to form the tunnel oxide layer of the flash memory device, a pure oxide layer is formed through a radical oxidation process and nitrogen is then implanted into the layer through an annealing process using nitrous oxide ($N_2O$) gas. Due to the above processes, a charge trap density at the interface between the semiconductor substrate and the tunnel oxide layer decreases. Further, stress-induced leakage current (SILC) characteristics and capacitance-voltage (C-V) characteristics are improved to enhance both cycling characteristics and charge retention characteristics.

However, there is a limit to the increase in concentration of nitrogen accumulated in the oxide layer through the nitrous oxide ($N_2O$) gas annealing process. To solve the above problem, an annealing process utilizing nitrogen monoxide (NO) gas having an excellent reactivity in place of nitrous oxide ($N_2O$) gas is performed to implant nitrogen into the oxide layer has been employed. When nitrous oxide ($N_2O$) gas is utilized in the annealing process, however, the tunnel oxide layer is degraded due to a change in the nitrogen profile in the tunnel oxide layer and a substitution of process gas.

SUMMARY OF THE INVENTION

The invention addresses the above problems. Accordingly, the invention provides a method of fabricating a semiconductor device in which nitrogen is accumulated in an oxide layer and a subsequent implantation process into the oxide layer is then performed to convert silicon (Si)-nitrogen (N) bonds to silicon (Si)-oxygen (O)-nitrogen (N) bonds in a process for forming a tunnel oxide layer. Accordingly, the invention can prevent degradation of performance characteristics caused by a change in nitrogen (N) profile, alleviate electrical stress, and increase oxygen density to enhance the characteristics of the semiconductor device such as the cycling characteristics and the charge retention characteristics.

A method of fabricating a flash memory device according to one embodiment of the invention comprises forming a first insulating layer on a semiconductor substrate, accumulating nitrogen at an interface between the semiconductor substrate and the first insulating layer to form a second insulating layer at the interface; and implanting oxygen into the second insulating layer to convert the second insulating layer to a third insulating layer.

In the above method, the first insulating layer preferably is formed of an oxide layer. The first insulating layer preferably is formed through a radical oxidation process. The radical oxidation process preferably is performed at a temperature of 800° C. to 950° C. and a pressure of 0.2 Torr to 0.6 Torr in an oxygen ($O_2$) and hydrogen ($H_2$) atmosphere.

The second insulating layer preferably comprises silicon-nitrogen (Si—N) bonds, for example being formed from a $Si_3N_4$ (silicon nitride) layer, and the third insulating layer preferably comprises silicon-oxygen-nitrogen (Si—O—N) bonds. The second insulating layer is preferably formed by accumulating nitrogen through an annealing process preferably using nitrous oxide ($N_2O$) gas or nitrogen monoxide (NO) gas. The annealing process using nitrogen monoxide (NO) gas preferably is performed at a temperature of 800° C. to 950° C. and a pressure of about 1 bar in nitrogen monoxide (NO) and nitrogen ($N_2$) atmosphere. The annealing process using nitrous oxide ($N_2O$) gas preferably is performed at a temperature of 800° C. to 950° C. and a pressure of about 1 bar in nitrous oxide ($N_2O$) atmosphere. Preferably, the second insulating layer is formed in an in-situ manner after forming the first insulating layer.

The oxygen preferably is implanted using an ozone ($O_3$) treatment process which preferably is performed at a temperature of 300° C. to 600° C. and a concentration of ozone ($O_3$) of 100 $g/m^3$ to 300 $g/m^3$. Preferably, the ozone treatment process is performed in an in-situ manner after forming the second insulating layer.

The method of fabricating the flash memory device of the invention preferably further comprises performing a cleaning process before forming the first insulating layer. The cleaning process preferably uses a hydrogen fluoride (HF) solution and a standard cleaning-1 (SC-1) solution.

BRIEF DESCRIPTION OF THE DRAWINGS

The above and other features and advantages of the invention will become readily apparent with reference to the following detailed description when considered in conjunction with the accompanying drawings wherein.

DESCRIPTION OF SPECIFIC EMBODIMENTS

Hereinafter, preferred embodiments of the invention are explained in more detail with reference to the accompanying drawings. However, the embodiments of the invention may be modified variously and the scope of the invention is not limited to the described embodiments. The description herein is provided to more completely illustrate the invention for those skilled in the art.

Figure 1A:
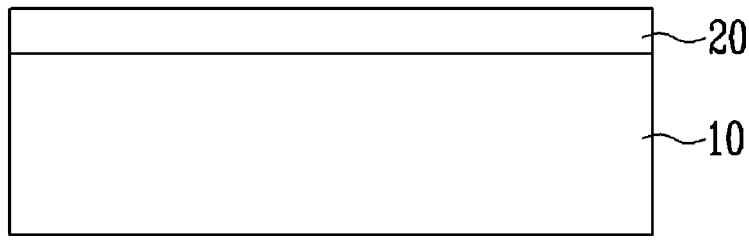
FIGS. 1A to 1C are sectional views of the flash memory device illustrating a method of fabricating the flash memory device according to one embodiment of the invention.
Figure 1B:
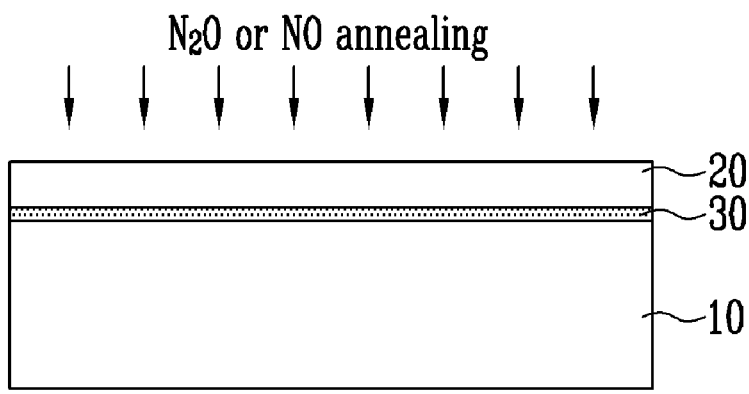
Figure 1C:
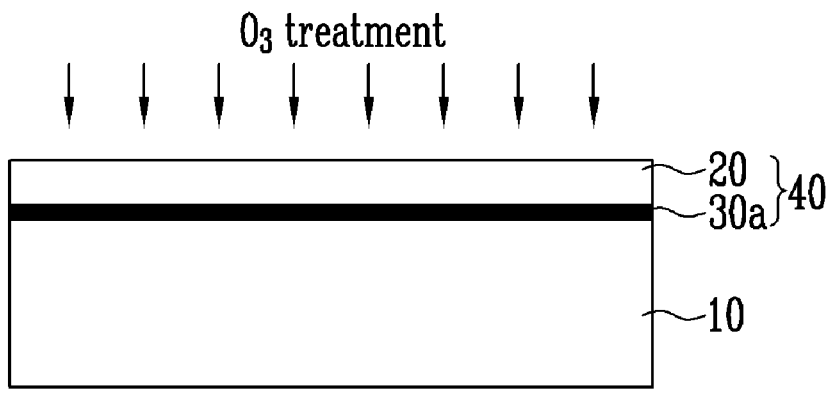

FIGS. 1A to 1C are sectional views of the flash memory device illustrating a method of fabricating the flash memory device according to one embodiment of the invention.

Referring to FIG. 1A, a semiconductor substrate 10 on which a well region (not shown) is formed is provided. The well region may have a triple structure. In this case, a screen oxide layer (not shown) is formed on the semiconductor substrate 10, and then a well ion implanting process and a threshold voltage ion implanting process are performed on the well region.

After the screen oxide layer is removed, a cleaning process can be further performed before forming a first insulating layer to be used for forming a tunnel oxide layer on the semiconductor substrate 10 on which the well region is formed. The cleaning process preferably uses a hydrogen fluoride (HF) solution and a standard cleaning-1 (SC-1) solution to remove a natural oxide layer and impurities.

Subsequently, a first insulating layer 20 is formed on the semiconductor substrate 10. The first insulating layer 20 can be formed of an oxide layer, and preferably can be formed of a silicon oxide ($SiO_2$) layer. The first insulating layer 20 can be formed through a radical oxidation process. In this case, the first insulating layer 20 is formed of a pure silicon oxide layer. Such a radical oxidation process can be performed at a temperature of 800° C. to 950° C. and a pressure of 0.2 Torr to 0.6 Torr in an atmosphere including oxygen ($O_2$) and hydrogen ($H_2$).

Due to the influence of hydrogen utilized in the radical oxidation process, however, defective, hydrogen-based bonds (i.e., dangling bonds) such as an Si—H bond are created at an interface between the semiconductor substrate 10 and the first insulating layer 20. Since such dangling bonds significantly increase defect charges trapped in the first insulating layer 20 to lower cycling characteristics and charge retention characteristics, the creation of the dangling bonds should be inhibited.

Referring to FIG. 1B, a process for accumulating nitrogen at the interface between the semiconductor substrate 10 and the first insulating layer 20 in an in-situ manner is performed. At this time, an annealing process using nitrous oxide ($N_2O$) gas or nitrogen monoxide (NO) gas can be performed to accumulate nitrogen. Preferably, the annealing process using nitrogen monoxide (NO) gas is performed at a temperature of 800° C. to 950° C. and a normal pressure (e.g., about 1 bar) in an atmosphere including nitrogen monoxide (NO) and nitrogen ($N_2$). Preferably, the annealing process using nitrous oxide ($N_2O$) gas is performed at a temperature of 800° C. to 950° C. and a normal pressure (e.g., about 1 bar) in an atmosphere including nitrous oxide ($N_2O$).

From this nitrogen accumulation process, hydrogen in the dangling bonds formed at the interface between the semiconductor substrate 10 and the first insulating layer 20 is substituted with nitrogen to form a second insulating layer 30 including silicon (Si)-nitrogen (N) bonds at the interface. Preferably, the second insulating layer 30 may be formed of a $Si_3N_4$ (silicon nitride) layer. Due to the second insulating layer 30 having the silicon (Si)-nitrogen (N) bonds, the density of interface trap charges generated necessarily at the interface between the semiconductor substrate 10 and the first insulating layer 20 is decreased, the stress-induced leakage current (SILC) is improved, and the capacitance-voltage (C-V) characteristics and the like are improved so that the cycling characteristics and the charge retention characteristics of a tunnel oxide layer to be formed later can be enhanced.

Referring to FIG. 1C, a process for implanting oxygen into the second insulating layer having accumulated nitrogen is performed in an in-situ manner. An ozone ($O_3$) treatment process can be performed to implant oxygen. Preferably, the ozone ($O_3$) treatment process is performed at a temperature of 300° C. to 600° C. and an ozone concentration of 100 g/m³ to 300 g/m³.

As a result of the ozone ($O_3$) treatment process, oxygen atoms are bonded to the second insulating layer 30 having the silicon (Si)-nitrogen (N) bonds, and so the second insulating layer 30 is converted to a third insulating layer 30a having silicon (Si)-oxygen (O)-nitrogen (N) bonds. Accordingly, a tunnel oxide layer 40 including the first insulating layer 20 and the third insulating layer 30a is completely formed.

At this time, the third insulating layer 30a having silicon (Si)-oxygen (O)-nitrogen (N) bonds can alleviate electrical stress, increase oxygen density, and improve surface roughness to enhance the characteristics of the device such as the cycling characteristics and the charge retention characteristics of the tunnel oxide layer 40.

In particular, when the annealing process using nitrogen monoxide (NO) gas is performed, it is possible to prevent the degradation of the tunnel oxide layer 40 caused by a change in the nitrogen (N) profile.

Although not shown in the drawings, a polysilicon layer for a floating gate is formed on the tunnel oxide layer 40, and a subsequent process is then performed to complete the flash memory device.

The above description relates to a method of forming the tunnel oxide layer in the flash memory device. However, the invention is applicable to a process for forming a gate insulating layer in a semiconductor device such as a dynamic random access memory (DRAM) and the like.

In the process for forming the tunnel oxide layer according to the invention, nitrogen is accumulated at an interface between the semiconductor substrate and the oxide layer through the annealing process using nitrous oxide ($N_2O$) gas or nitrogen monoxide (NO), and the subsequent ozone ($O_3$) treatment process converts the silicon (Si)-nitrogen (N) bonds to the silicon (Si)-oxygen (O)-nitrogen (N) bonds so that electrical stress can be alleviated, oxygen density can be increased, and surface roughness may be improved to enhance the semiconductor device characteristics such as the cycling characteristics and the charge retention characteristics of the tunnel oxide layer. In addition, when the annealing process using nitrogen monoxide (NO) gas is performed, the degradation of the tunnel oxide layer caused by a change of nitrogen (N) profile can be further prevented.

Although the invention has been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a flash memory device, comprising:
    forming a first insulating layer on a semiconductor substrate;
    accumulating nitrogen at an interface between the semiconductor substrate and the first insulating layer to form a second insulating layer having silicon-nitrogen Si—N bonds at the interface; and implanting oxygen into the second insulating layer to convert the second insulating layer to a third insulating layer having silicon-oxygen-nitrogen (Si—O—N) bonds.

2. The method of fabricating the flash memory device of claim 1, wherein the first insulating layer comprises an oxide layer.

3. The method of fabricating the flash memory device of claim 1, comprising forming the first insulating layer using a radical oxidation process.

4. The method of fabricating the flash memory device of claim 3, wherein the radical oxidation process comprises performing radical oxidation in an atmosphere comprising oxygen ($O_2$) and hydrogen ($H_2$).

5. The method of fabricating the flash memory device of claim 3, comprising performing the radical oxidation process at a temperature of 800° C. to 950° C. and a pressure of 0.2 Torr to 0.6 Torr.

6. The method of fabricating the flash memory device of claim 1, wherein the second insulating layer comprises a $Si_3N_4$ (silicon nitride) layer.

7. The method of fabricating a flash memory device of claim 1, wherein the nitrogen accumulation step comprises performing an annealing process using nitrous oxide ($N_2O$) gas or nitrogen monoxide (NO) gas.

8. The method of fabricating the flash memory device of claim 7, wherein the annealing process comprises using nitrogen monoxide (NO) gas at a temperature of 800° C. to 950° C. and a pressure of about 1 bar in an atmosphere comprising nitrogen monoxide (NO) and nitrogen ($N_2$).

9. The method of fabricating the flash memory device of claim 7, wherein the annealing process comprises using nitrous oxide ($N_2O$) gas at a temperature of 800° C. to 950° C. and a pressure of about 1 bar in an atmosphere comprising nitrous oxide ($N_2O$).

10. The method of fabricating the flash memory device of claim 1, comprising forming the second insulating layer in an in-situ manner after forming the first insulating layer.

11. The method of fabricating the flash memory device of claim 1, wherein the oxygen implantation step comprises performing an ozone ($O_3$) treatment process.

12. The method of fabricating the flash memory device of claim 11, comprising performing the ozone ($O_3$) treatment process at a temperature of 300° C. to 600° C. and a concentration of ozone ($O_3$) of 100 $g/m^3$ to 300 $g/m^3$.

13. The method of fabricating the flash memory device of claim 11, comprising performing the ozone ($O_3$) treatment process in an in-situ manner after forming the second insulating layer.

14. The method of fabricating the flash memory device of claim 1, further comprising performing a cleaning process before forming the first insulating layer.

15. The method of fabricating the flash memory device of claim 14, wherein the cleaning process comprises using a hydrogen fluoride (HF) solution and standard cleaning-1 (SC-1) solution.

* * * * *